(12) United States Patent
Tsukinoki

(10) Patent No.: US 8,219,233 B2
(45) Date of Patent: Jul. 10, 2012

(54) SUBSTRATE TREATMENT APPARATUS

(75) Inventor: Wataru Tsukinoki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 268 days.

(21) Appl. No.: 12/656,123

(22) Filed: Jan. 19, 2010

(65) Prior Publication Data

US 2010/0204821 A1 Aug. 12, 2010

(30) Foreign Application Priority Data

Feb. 10, 2009 (JP) .................................. 2009-028647

(51) Int. Cl.
*G06F 19/00* (2006.01)
*H01L 21/677* (2006.01)

(52) U.S. Cl. ......... 700/112; 700/101; 700/121; 414/940

(58) Field of Classification Search ................... 700/100, 700/101, 112, 121, 218.228; 414/935, 940
See application file for complete search history.

(56) References Cited

U.S. PATENT DOCUMENTS 7,529,595 B2 * 5/2009 Shinozuka et al. ........... 700/121
7,844,359 B2 * 11/2010 Shin et al. ..................... 700/121
2007/0088450 A1 * 4/2007 Shinozuka et al. ........... 700/101
2008/0299502 A1 * 12/2008 Shin et al. ..................... 430/324

FOREIGN PATENT DOCUMENTS

JP A-2004-193597 7/2004

* cited by examiner

*Primary Examiner* — Charles Kasenge
(74) *Attorney, Agent, or Firm* — Posz Law Group, PLC

(57) ABSTRACT

The invention controls a carrier moving and mounting device such that at normal time, the device moves and mounts carriers in sequence to a delivery mounting units according to a carry-in order, and when a priority carrier is carried into the carry-in mounting unit and if all of the delivery mounting units are occupied by the carriers, the device moves and mounts one of the carriers on the retreat mounting unit, and mounts the priority carrier on the delivery mounting unit which has become vacant by the movement; and controls a delivery device such that at normal time, the delivery device carries the substrates out of the carriers according to the carry-in order of the carriers mounted on the delivery mounting units, and when the priority carrier is mounted, the delivery device carries out the substrates in the priority carrier before the substrates in the other carriers.

6 Claims, 14 Drawing Sheets

(CARRY-IN ORDER)

(TREATMENT ORDER)

FIG.14
(a)
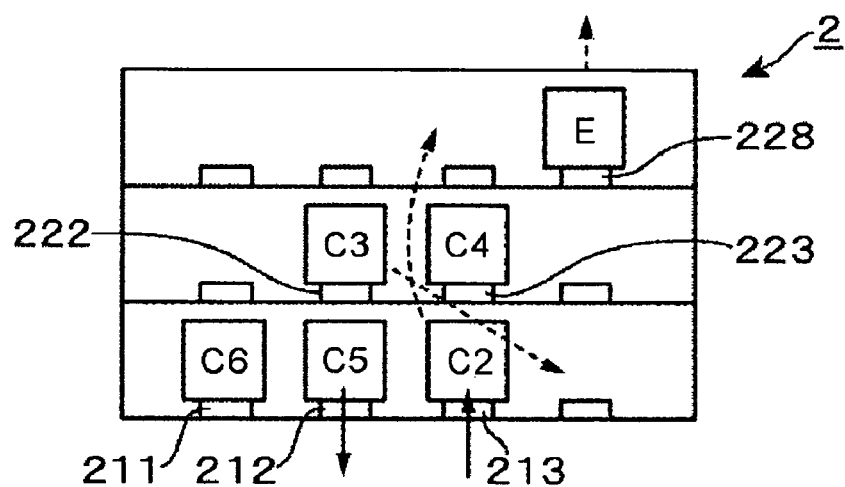
(b)
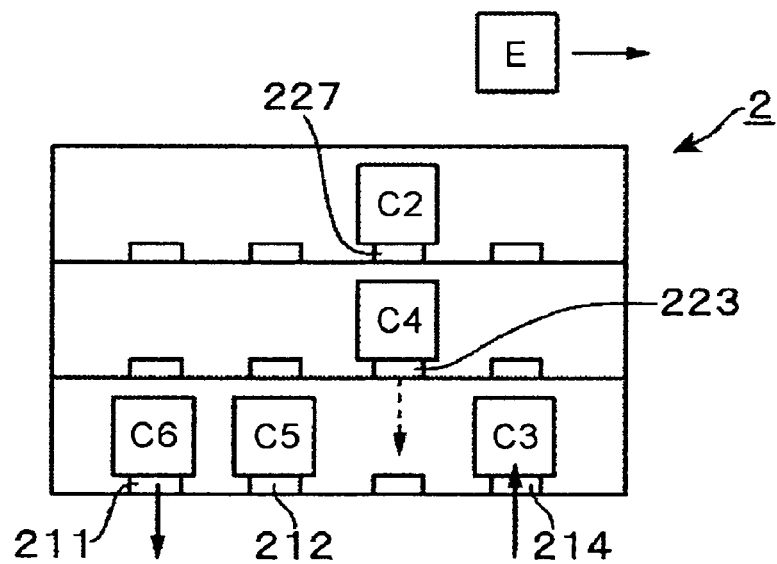

SUBSTRATE TREATMENT APPARATUS

BACKGROUND OF THE INVENTION

1. Field of the Invention

The present invention relates to a substrate treatment apparatus performing treatments such as a coating treatment of a resist solution, a developing treatment after exposure and the like, on a substrate such as a semiconductor wafer, an LCD substrate (a glass substrate for a liquid crystal display) or the like.

2. Description of the Related Art

In a manufacturing process of a semiconductor device and an LCD substrate, formation of a resist pattern on a substrate is performed by a technique called photolithography. This technique is performed by a series of processes by applying a resist solution to a substrate such as a semiconductor wafer (hereinafter, referred to as a "wafer") to form a solution film on the front surface of the wafer, exposing the resist film to light using a photomask, and then performing a developing treatment thereon to obtain a desired pattern on the substrate.

Such treatments are usually performed using a resist pattern forming system in which an aligner is connected to a coating and developing apparatus performing coating and development of the resist solution. In this system, for example, carriers 10 each housing many wafers therein are carried into a carrier stage 11 of a carrier block 1A, and the wafers in the carriers 10 are delivered by a delivery arm 12 to a treatment block 1B as shown in FIG. 15. In the treatment block 1B, formation of an anti-reflection film in an anti-reflection film forming module (not shown) and formation of a resist film in a coating module 13 are performed on the wafers, and the wafers are then carried to an aligner 1D via an interface block 1C.

On the other hand, the wafers after exposure processing are returned again to the treatment block 1B and subjected to a developing treatment in a developing module 14, and then returned to the original carriers 10. Before and after the formation treatments of the anti-reflection film and the resist film and before and after the developing treatment, heating treatments and cooling treatments of the wafers are performed. Heating modules performing the heating treatments, cooling modules performing the cooling treatments and so on are arranged in multi tiers in shelf modules 15 15A to 15C), and the wafers are carried between the modules by main arms 16 (16A and 16B) provided in the treatment block 1B.

Normally, a carrier 10 is prepared for each lot for treatment, and the wafers carried out of one carrier 10 to the treatment block 1B are subjected to predetermined treatments and processing in the treatment block 1B and the aligner 1D, and then housed in the original carrier 10. In this event, a plurality of, for example, four carriers 10 are mounted on the carrier stage 11 and, for example, the delivery arm 12 is configured to be accessible to all of the carriers 10. The vacant carrier 10 from which the wafers have been carried out to the treatment block 1B stands by on the carrier stage 11 until the predetermined treatments on the wafers are completed, and the wafers for which the treatments have been completed are returned into the carrier 10, and then the carrier 10 housing the treated wafers is exchanged with a carrier 10 housing untreated wafers (Japanese Patent Application Laid-open No. 2004-193597).

Incidentally, the order of carriage into the carrier stage 11 of the carriers 10 which will be carried into the coating and developing apparatus has been determined in advance. The carriage of the wafers is performed such that the wafers in the carriers 10 are carried out, in the order that the carriers 10 have been carried in, to the treatment block 1B by the delivery arm 12 and subjected to treatments in the treatment block 1B, and the treated wafers are returned to the original carriers 10.

However, there may be a case in which a "priority lot" for substrates for evaluation test, substrates for research and development, experimental substrates and so on which are subjected to treatments on a priority basis ignoring the determined carry-in order of the carriers 10, is generated. In this case, a carrier housing wafers for the priority lot (hereinafter, referred to as a "priority carrier") is carried into the carrier stage 11 breaking into the determined carry-in order of the carriers 10, and the wafers in the priority carrier are carried out to the treatment block 1B on a priority basis by the delivery arm 12 and subjected to treatments.

In this event, if there is a mounting unit for carrying-in the priority carrier in the carrier stage 11, the priority carrier can be immediately carried into the mounting unit and the wafers in the carrier can be carried out to the treatment block 1B and subjected to treatments, thus causing no problem. However, if mounting the unit on the carrier stage 11 is occupied by another carrier 10, the priority carrier can be carried into the carrier stage 11 only after waiting until the timing when all of the treatments on the wafers in the carrier 10 are completed and the carrier 10 is exchanged with a carrier 10 housing untreated wafers. In such a case, carry-out of the wafers in the priority carrier to the treatment block 1B is delayed, bringing about a problem that the waiting time even of the priority carrier before start of treatments is increased.

SUMMARY OF THE INVENTION

The present invention has been made under such circumstances, and its object is to reduce, when a priority lot which is subjected to treatment having priority over other lots has been generated, the waiting time of substrates in the priority lot before start of treatment.

The substrate treatment apparatus according to the present invention is a substrate treatment apparatus including delivery mounting units on each of which a carrier housing a plurality of substrates is mounted, the delivery mounting unit being prepared for each carrier, for performing treatments on the substrates carried out of the carriers mounted on the delivery mounting units by a delivery device and then returning the substrates into original carriers on the delivery mounting units by the delivery device, the apparatus including:

a plurality of retreat mounting units separately provided from the delivery mounting units, for mounting the carriers thereon;

a carry-in mounting unit separately provided from the delivery mounting units, for carrying the carrier from an external part into the substrate treatment apparatus;

a carrier moving and mounting device moving and mounting the carrier among the delivery mounting unit, retreat mounting unit, and carry-in mounting unit;

a control unit controlling the carrier moving and mounting device such that at normal time, the carrier moving and mounting device moves and mounts the carriers in sequence to the delivery mounting units directly or via the retreat mounting units according to a carry-in order of the carriers carried into the carry-in mounting unit, and when a priority carrier housing substrates in a priority lot which will be subjected to treatments on a priority basis is carried into the carry-in mounting unit and if all of the delivery mounting units are occupied by the carriers, the carrier moving and mounting device moves and mounts one of the carriers on the retreat mounting unit, and mounts the priority carrier on the delivery mounting unit which has become vacant by the movement; and a control unit controlling the delivery device such that at normal time, the delivery device carries the substrates out of the carriers according to the carry-in order of the carriers mounted on the delivery mounting units, and when the priority carrier is mounted on the delivery mounting unit, the delivery device carries out the substrates in the priority carrier before the substrates in the other carriers.

According to the present invention, in the case where a priority lot which will be subjected to treatments having priority over other lots has been generated, if all of the delivery mounting units are occupied by carriers when a priority carrier for the priority lot is carried into the carry-in mounting unit, the occupying carrier is moved and mounted on the retreat mounting unit so that the priority carrier can be mounted on the delivery mounting unit which has become vacant by the movement. Therefore, the priority carrier can be mounted on the delivery mounting unit after a short waiting time, and the substrates in the priority carrier can be immediately carried out by the delivery device, so that the waiting time of the substrates in the priority carrier before start of treatment can be reduced.

BRIEF DESCRIPTION OF THE DRAWINGS

FIG. 14 is a process chart for explaining the operation of the resist pattern forming system.

DETAILED DESCRIPTION OF THE INVENTION

Figure 1:
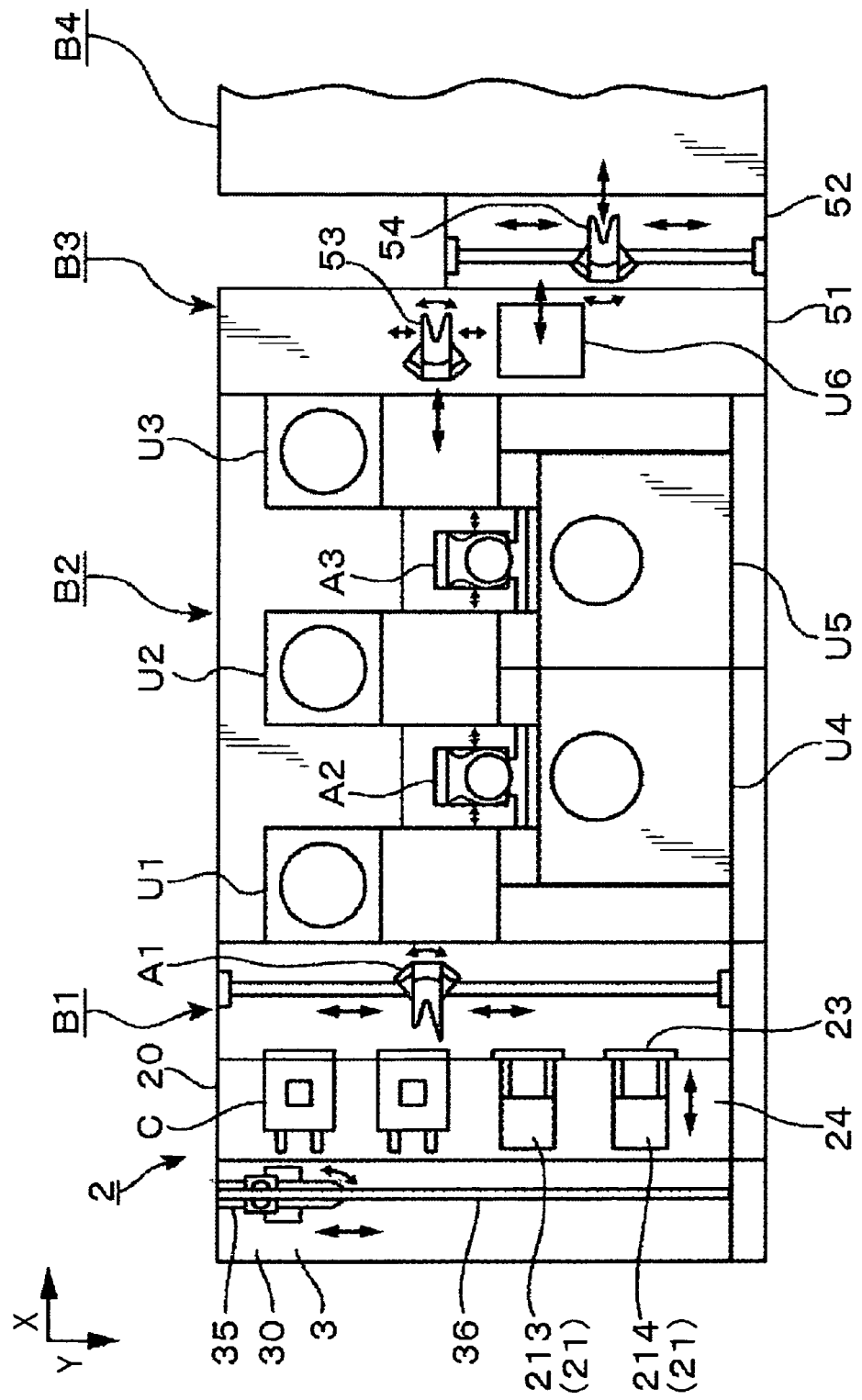
FIG. 1 is a plan view of a resist pattern forming system according to an embodiment of the present invention.
Figure 2:
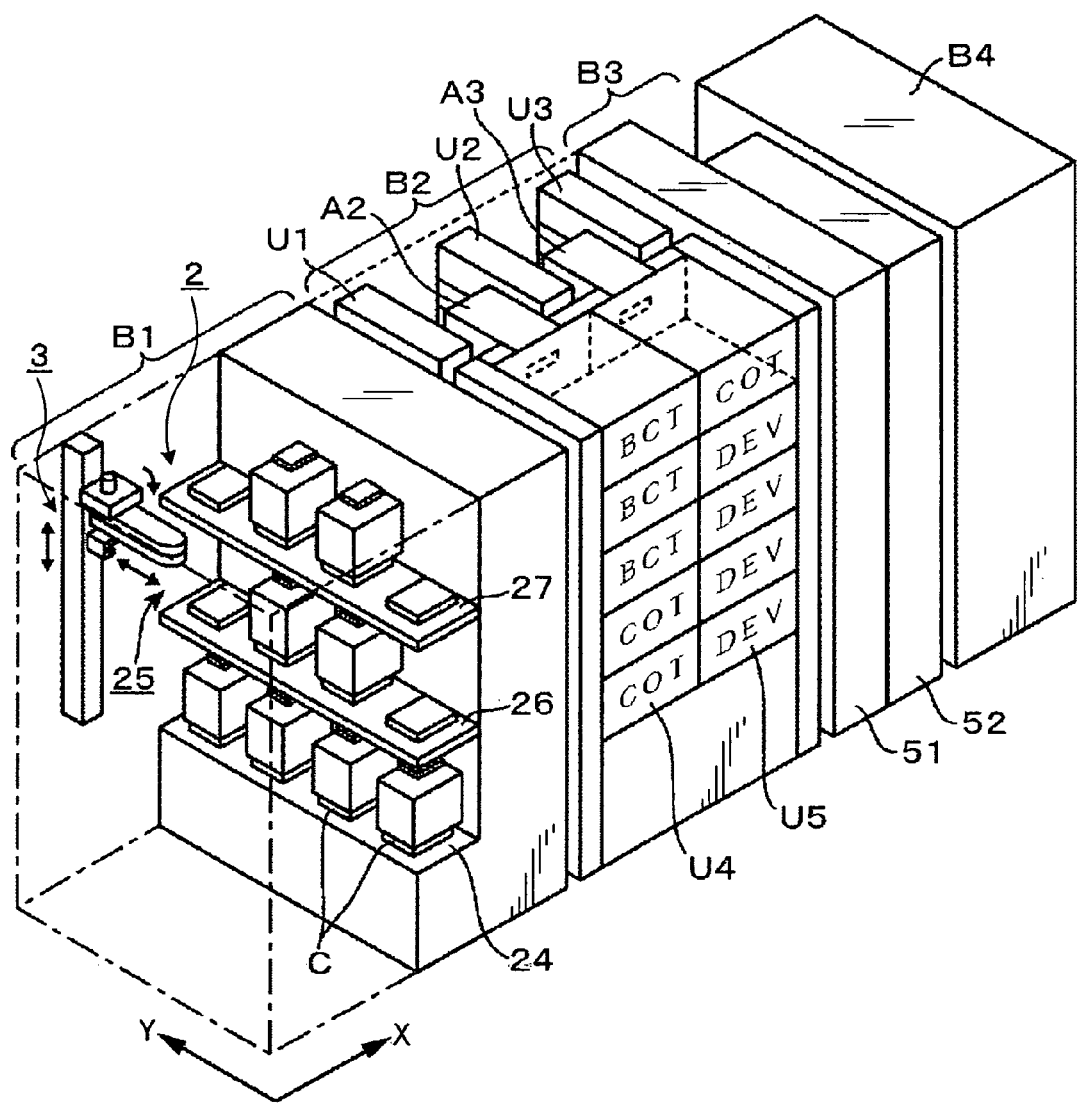
FIG. 2 is a perspective view showing the resist pattern forming system.
Figure 3:
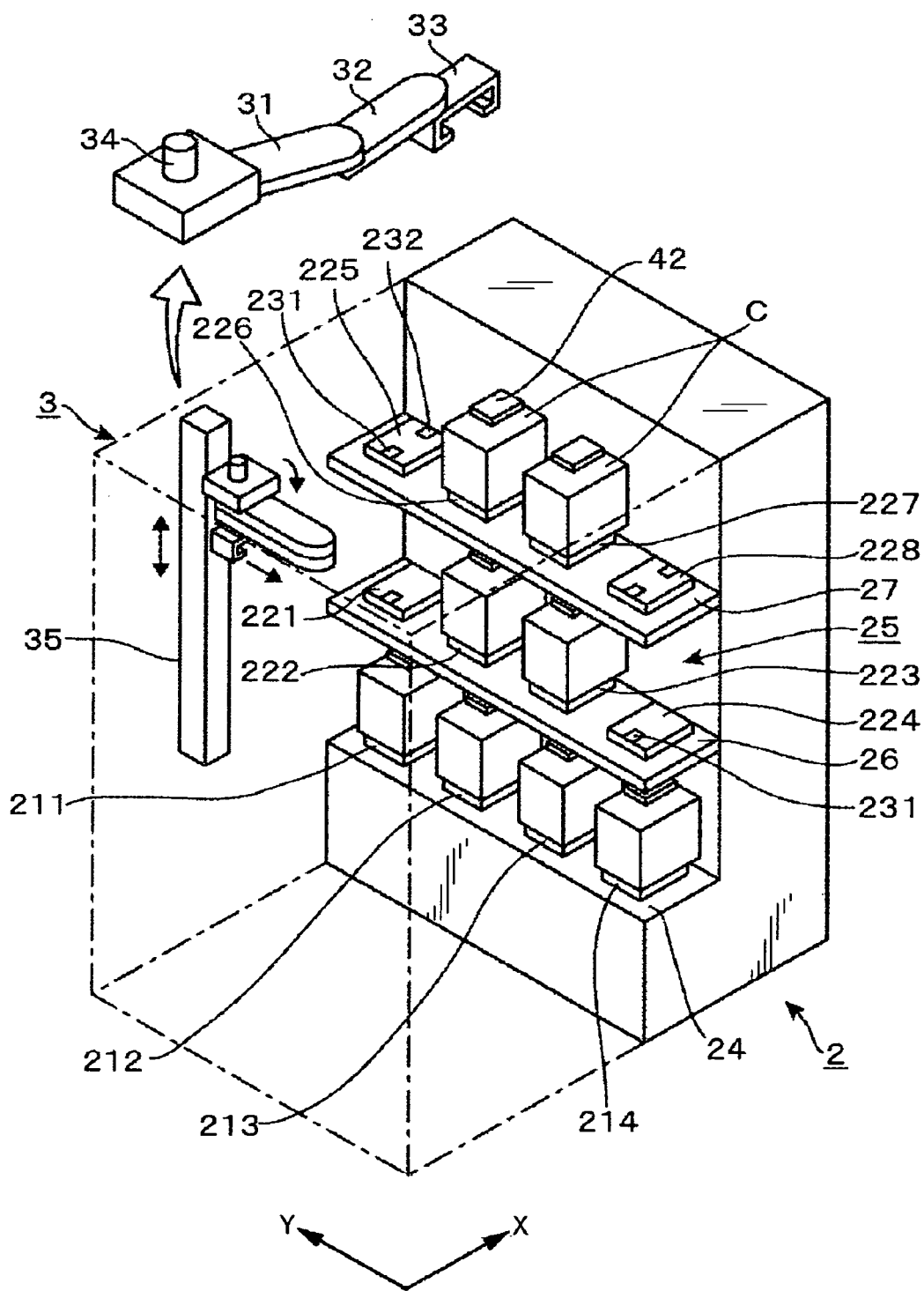
FIG. 3 is a perspective view showing a carrier block in the resist pattern forming system.

Hereinafter, a substrate treatment apparatus of the present invention will be described taking a case where it is applied to a coating and developing apparatus as an example. A resist pattern forming system in which an aligner is connected to the coating and developing apparatus will be described first referring to the drawings. FIG. 1 is a plan view of one embodiment of the resist pattern forming system, and FIG. 2 is a schematic perspective view of the system. B1 in the drawings denotes a carrier block for carrying in/out carriers C in each of which, for example, substrates, for example, 13 wafers are hermetically housed, B2 denotes a treatment block performing coating and developing treatments on the wafers, B3 denotes an interface block, and B4 denotes an aligner. In the carrier block B1, for example, a carrier station 2 in which delivery mounting units 21 (211 to 214) and retreat mounting units 22 (221 to 228) for the carriers C are provided in multiple tiers as shown in FIG. 3; open/close units 23 provided in a wall surface located ahead as seen from the carrier station 2; and a delivery device A1 for delivering a wafer between the carrier C mounted on the delivery mounting unit 21 and the later-described treatment block B2 are provided. The carrier block B1 is enclosed, for example, by a casing 20.

The carrier station 2 includes, for example, a mounting stage 24 on which a plurality of the delivery mounting units 21 (211 to 214) are provided, and a stocker 25 provided above the mounting stage 24 and forming a storage unit for temporarily storing the carriers C. The stocker 25 includes shelf units 26 and 27 provided in a plurality of, for example, two tiers. The delivery mounting unit 21 is a mounting unit prepared for each carrier and accessed by the delivery device A1, and a plurality of, for example, four delivery mounting units 21 are arranged on the mounting stage 24 side by side in a Y-direction in the drawing to allow the mounted carriers C to be fixed thereon, and are configured to be slidable in an X-direction in the drawings, so that not-shown wafer takeout ports provided on the carriers C can be connected to the open/close units 23.

In this example, for example, two delivery mounting units 211 and 212 among the delivery mounting units 211 to 214 on the mounting stage 24 are allocated as wafer carry-in units for carrying wafers out of the carriers C into the treatment block B2, and the remaining two delivery mounting units 213 and 214 are allocated as wafer carry-out units for returning the wafers from the treatment block B2 into the carriers C. Furthermore, the delivery device A1 is configured to be movable in the Y-direction, movable backward and forward, and rotatable around the vertical axis in order to deliver the wafers to the four delivery mounting units 211 to 214.

Many mounting units, each of which is prepared for each carrier C, for mounting the carriers C thereon and temporarily storing them are arranged in the stocker 25. In this example, the mounting units in the stocker 25 also serve as the retreat mounting units 22. For the retreat mounting units 22, a plurality of, for example, four retreat mounting units 221 to 224 are arranged side by side in the Y-direction, for example, on the shelf unit 26 on the lower tier side in the stocker 25, and a plurality of, for example, four retreat mounting units 225 to 228 are arranged side by side in the Y-direction on the shelf unit 27 on the upper tier side.

Among the retreat mounting units 225 to 228 on the upper tier side, for example, two retreat mounting units 225 and 226 here are used as carrier carry-in units forming the carry-in mounting units through which the carriers C will be carried from the external part into the resist pattern forming system. The remaining two retreat mounting units 227 and 228 are used as the carrier carry-out units on which the carriers C will be mounted when the carriers C are carried out of the resist pattern forming system to the external part. Further, these retreat mounting units 221 to 228 are configured such that the carriers C are mounted and fixed thereon.

Figure 4:
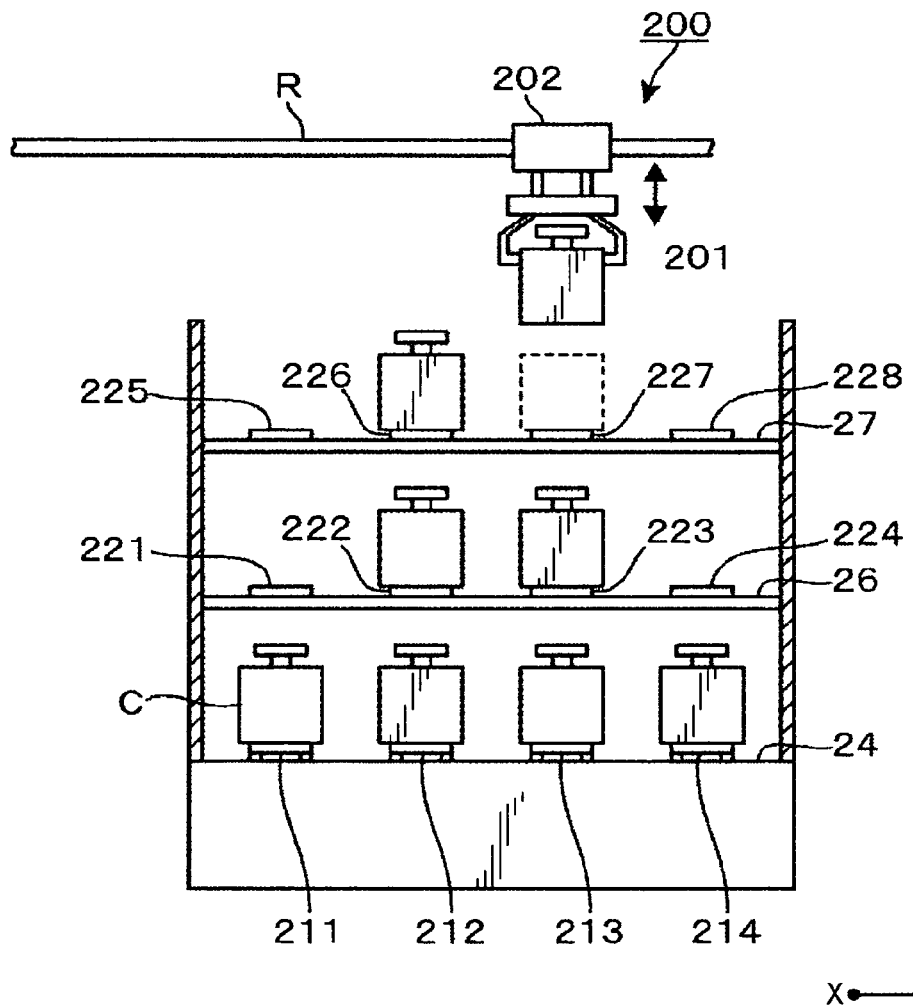
FIG. 4 is a front view of the carrier block seen from the side of a carrier moving and mounting device.

As shown in FIG. 4, above the shelf unit 27 on the upper tier side, a rail R extending in the Y-direction in the drawing is provided. On the rail R, an external carrier carry device 200 is provided which carries the carrier C between the resist pattern forming system and another treatment apparatus in the external part. The external carrier carry device 200 includes a grip unit 201 holding the carrier C, and the grip unit 201 is configured to support the carrier C in a manner to grip sides of the carrier C in the lateral direction. Further, the external carrier carry device 200 is configured to be movable along the rail R, and is configured to freely lift up and down so as to mount the carriers C on the retreat mounting units 225 and 226 serving as the carrier carry-in units and to receive the carriers C from the retreat mounting units 227 and 228 serving as the carrier carry-out units on the shelf unit 27 on the upper tier side through use of a lift device 202.

Further, the carrier block B1 includes a carrier moving and mounting device 3 for delivering the carrier C to/from each of the delivery mounting units 211 to 214 and the retreat mounting units 221 to 228 in the carrier station 2 as shown in FIG. 1 to FIG. 3. The carrier moving and mounting device 3 is an articulated arm composed of, for example, a first arm 31, a second arm 32, and a holding arm 33, and is configured to be movable backward and forward, and is configured to be rotatable around the vertical axis by means of a rotation mechanism 34.

Figure 5:
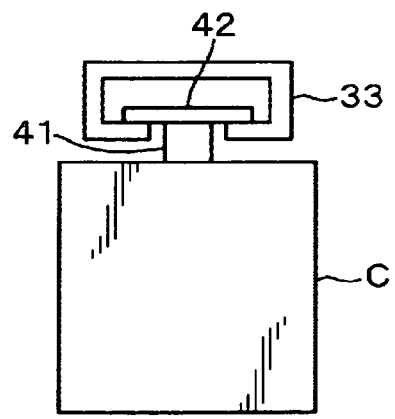
FIG. 5 is a front view showing a carrier.

Explaining here the shape of the carrier C, a plate-shaped holding plate 42 is provided on an upper surface of the carrier C via a support part 41 as shown in FIG. 2 to FIG. 5. The holding arm 33 of the carrier moving and mounting device 3 surrounds the holding plate 42 of the carrier C so as to support the carrier C in a hanging state, for example, as shown in FIG. 5.

Such a carrier moving and mounting device 3 is configured to freely lift up and down along a lift shaft 35, and the lift shaft 35 is configured to be movable along a guide rail 36 (see FIG. 1) provided extending in the Y-direction in FIG. 1, for example, at the ceiling portion of the carrier block B1. This allows the carrier moving and mounting device 3 to move and mount the carrier C on each of the delivery mounting units 211 to 214 and the retreat mounting units 221 to 228 in the carrier station 2. Further, the carrier moving and mounting device 3 is configured to wait in a retreat region 30 when it is not performing the moving and mounting work for the carrier C. The retreat region 30 is set, for example, on one of the sides in the lateral direction of the carrier station 2 when the carrier station 2 is seen from the carrier moving and mounting device 3 side, as shown in FIG. 1.

Each of such delivery mounting units 211 to 214 and the retreat mounting units 225 to 228 on the upper tier is provided, for example, with a position sensor 231 for verifying the mounting position of the carrier C and a presence sensor 232 for verifying the presence of the carrier C as shown in FIG. 3. The retreat mounting units 221 to 224 on the middle tier are provided with the position sensors 231. As each of the position sensors 231 and the presence sensors 232, a reflection-type photosensor, a sensor sensing movement of a striker which detects the position and the presence of a carrier C when the carrier C is mounted on the mounting unit 211 to 214 or 221 to 228, by bumping into the bottom portion of the carrier C, or the like is used.

To the back side of the carrier block B1, the treatment block B2 is connected. In the treatment block B2, shelf modules U1 to U3 in which heating and cooling system modules are multi-tiered and main arms A2 and A3 delivering the wafer between the modules in the shelf modules U1 to U3 and later-described solution treatment modules U4 and U5, are alternately arranged in order from the front side. More specifically, the shelf modules U1, U2, and U3 and the main arms A2 and A3 are arranged one after the other in one line as seen from the carrier block B1 side, and not-shown openings for carrying the wafer are provided at connection regions between them, so that the wafer can be freely moved in the treatment block B2 from the shelf module U1 on one end side to the shelf module U3 on the other end side.

The shelf modules U1 to U3 have a configuration in which various modules for performing pre-treatment and post-treatment performed in the solution treatment modules U4 and U5 are stacked in a plurality of tiers, for example, 10 tiers, and include a delivery module (TRS), temperature regulating modules (CPL) each for regulating the wafer to a predetermined temperature, heating modules (CLH) each for performing heating treatment on the wafer, heating modules (CPH) each for performing heating treatment on the wafer after a resist solution is applied, heating modules (PEB) each for performing heating treatment on the wafer before developing treatment, heating modules (POST) each for performing heating treatment on the wafer after developing treatment and so on.

The solution treatment modules U4 and U5 are configured such that anti-reflection film forming modules BCT each for applying a treatment solution for forming an anti-reflection film to the wafer, coating modules COT each for applying a resist solution to the wafer, developing modules DEV each for supplying a developing solution to the wafer to develop it and so on are stacked in a plurality of tiers, for example, five tiers as shown in FIG. 2.

To the back side of the shelf module U3 in the treatment block B2, the aligner B4 is connected via the interface block B3. The interface block B3 is composed of a first carry chamber 51 and a second carry chamber 52 which are provided one after the other between the treatment block B2 and the aligner B4 as shown in FIG. 1. The first carry chamber 51 and the second carry chamber 52 include a first carry arm 53 and a second carry arm 54 which can lift up and down, rotate around the vertical axis, and move backward and forward, respectively. Furthermore, in the first carry chamber 51, a shelf module U6 is provided in which, for example, delivery modules and so on are stacked one on the other.

The main arms A2 and A3 are configured to deliver the wafer between all of the modules (places where the wafer to be placed) in the treatment block B2, that is, the modules in the shelf modules U1 to U3 and the modules in the solution treatment modules U4 and U5. Thus, the main arms A2 and A3 are configured to be able to move backward and forward, lift up and down, rotate around the vertical axis, and move in the Y-axis direction. Further, each of the main arms A2 and A3 includes two holding arms (not shown) each for supporting a peripheral region on a rear surface side of the wafer, and these holding arms can move backward and forward independently of each other.

Figure 6:
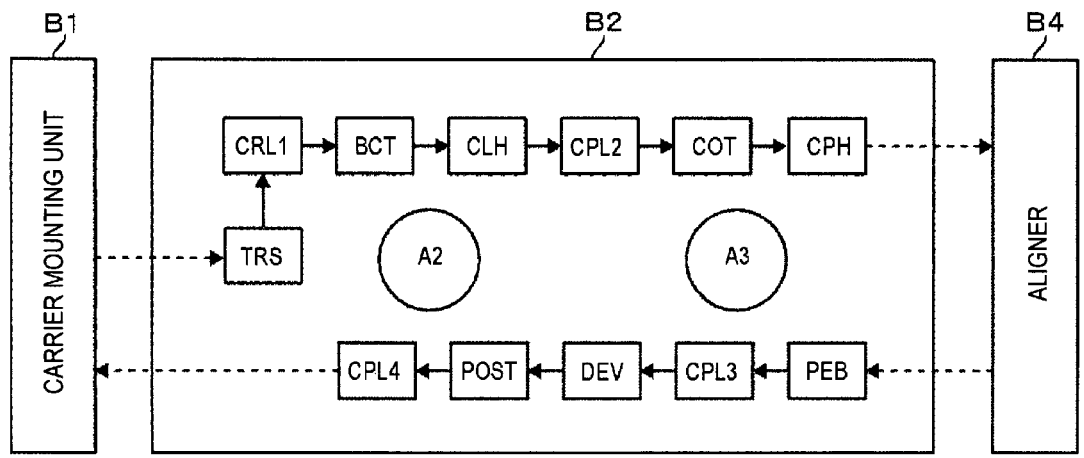
FIG. 6 is a plan view showing a carry passage of a wafer in a treatment block in the resist pattern forming system.

Explaining one example of the flow of the wafer in the above-described resist pattern forming system referring to FIG. 6, the wafers in the carrier C mounted on the wafer carry-in unit 211 (212) in the carrier block B1 are delivered to the delivery module TRS in the shelf module U1 in the treatment block B2, and carried from the delivery module TRS through a passage of the temperature regulating module CPL1, the anti-reflection film forming module BCT, the heating module CLH, the temperature regulating module CPL2, the coating module COT, the heating module CPH, the interface block B3, and the aligner B4, and subjected to exposure processing in the aligner B4. On the other hand, the wafers after exposure processing are returned to the treatment block B2, and carried through a passage of the heating module PEB, the temperature regulating module CPL3, the developing module DEV, the heating module POST, and the temperature regulating module CPL4, and returned from the temperature regulating module CPL4 to the original carrier C mounted on the wafer carry-out unit 213 (214) in the carrier block B1.

In this event, the main arms A2 and A3 receive the wafers from the delivery module TRS in the shelf module U1 in the treatment block B2, and carry the wafers along the carry passage which has been already described via the temperature regulating module CPL and so on sequentially to the heating module CPH. The main arms A2 and A3 then receive the exposed wafers from the interface block B3, and carry the wafers along the carry passage which has been already described via the heating module PEB and so on sequentially to the temperature regulating module CPL4. To implement such a carry procedure, the main arms A2 and A3 are controlled to perform a series of operations (a carry cycle) of carrying the wafers placed in the modules one by one from the downstream module to the upstream module.

The above-described resist pattern forming system includes a control unit 6 (see FIG. 7 and FIG. 8) composed of a computer which performs management of recipes of the treatment modules, management of the recipe of the carry flow (the carry passage) of the wafer, the treatments in the treatment modules, and drive control of the external carrier carry device 200, the carrier moving and mounting device 3, the delivery device A1, the main arms A2 and A3 and so on. The control unit 6 has a program storage unit (not shown) composed, for example, of computer programs. In the program storage unit, stored are programs composed of, for example, software including a step (command) group to implement the operation of the whole resist pattern forming system, that is, the treatments in the modules and the carriage of the wafers and so on in order to form a predetermined resist pattern on the wafer. Then, the programs are read out to the control unit 6, whereby the operation of the whole resist pattern forming system is controlled by the control unit 6. Note that the programs are stored in the program storage unit in the state that they are held, for example, in a storage medium such as a flexible disk, a hard disk, a compact disk, a magneto-optical disk, a memory card or the like.

Figure 7:
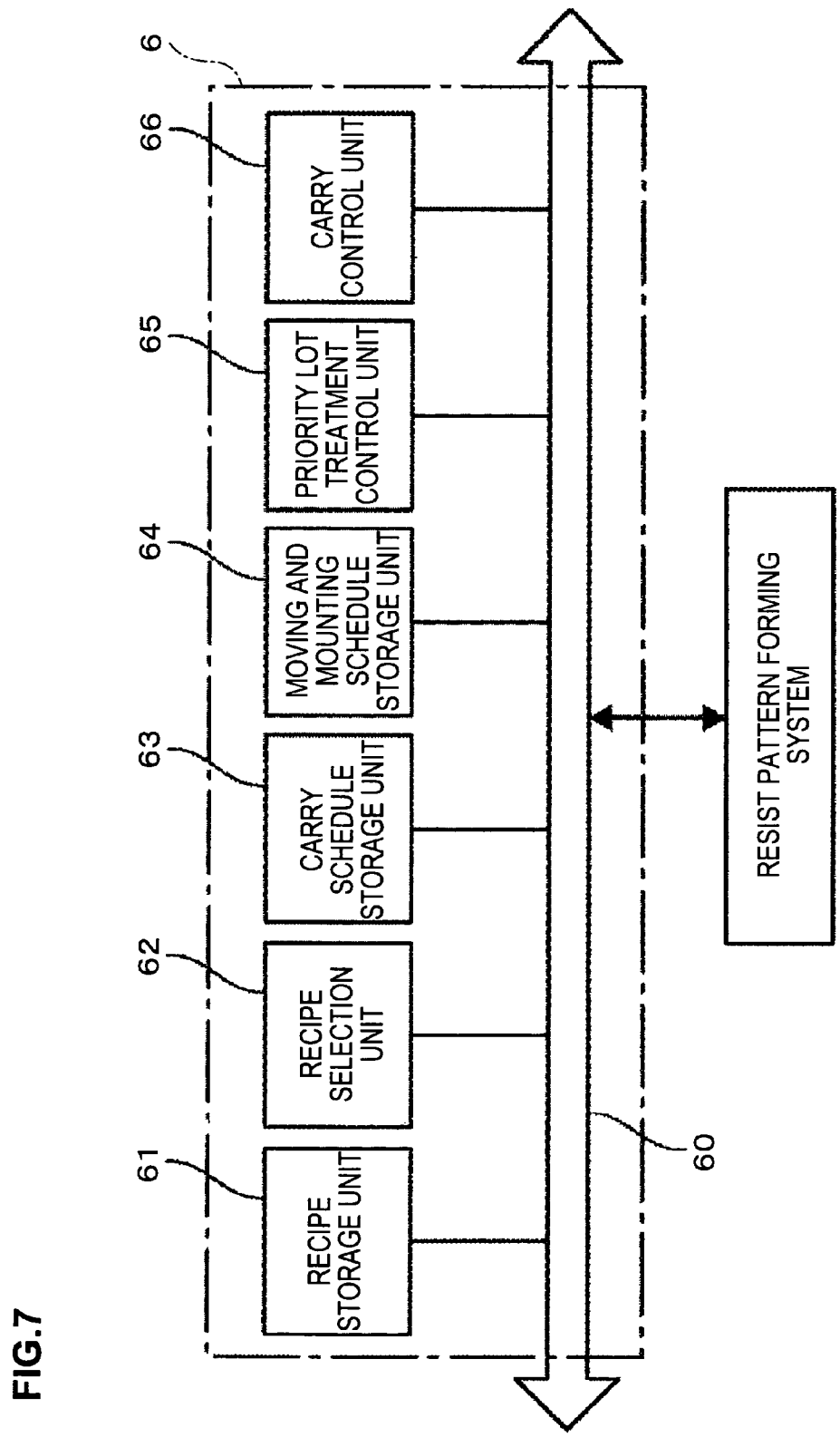
FIG. 7 is a configuration diagram showing a part of a control unit in the resist pattern forming system.

FIG. 7 shows the configuration of the control unit 6, which is actually composed of a CPU (central processing unit), programs, and a memory and so on. In the present invention, the control unit 6 is characteristic by carriage of the carrier housing wafers in a priority lot when the priority lot is generated, and therefore the control unit 6 will be described with part of components relating to the carriage of the carrier divided into blocks. A numeral 60 in FIG. 7 denotes a bus to which a recipe storage unit 61, a recipe selection unit 62, a carry schedule storage unit 63, a moving and mounting schedule storage unit 64, a priority lot treatment control unit 65, and a carry control unit 66, are connected.

The recipe storage unit 61 stores, for example, a carry recipe in which the carry passage of the wafer is recorded, and a plurality of recipes in which conditions of treatments performed on the wafer are recorded. The carry schedule storage unit 63 is a device storing a schedule of contents such as the timings when all of the wafers in a lot are carried to which modules based on the carry recipe, for example, a carry schedule created by assigning numbers of order to the wafers and arranging, in time sequence, data of the carry cycles in which a carry cycle is designated associating the order numbers of the wafers and the modules.

The moving and mounting schedule storage unit 64 is a device storing the moving and mounting schedule of the carriers C in the carrier station 2. Here, addresses are given to the delivery mounting units 211 to 214 and the retreat mounting units 221 to 228, respectively, and unique IDs are also given to the carriers C respectively. Therefore, in this moving and mounting schedule, the carriers C and the delivery mounting units 211 to 214 and the retreat mounting units 221 to 228 are associated in time sequence, and the timings when which of the carriers C is moved to and mounted on which of the delivery mounting units 211 to 214 and the retreat mounting units 221 to 228 are written in time sequence.

The priority lot treatment control unit 65 is a unit controlling the carrier moving and mounting device 3 and the delivery device A1 such that when the priority lot to be treated on a priority basis has been generated, the wafers in the priority lot are treated on a first priority basis. The priority lot here means a lot which is carried first into the retreat mounting unit 225 or 226 serving as the carrier carry-in unit and the wafers therein are delivered to the treatment block B2 prior to those in the preceding carriers from which the wafers have not been delivered yet to the treatment block B2, and the carrier housing the wafers in the priority lot is referred to as a priority carrier.

Therefore, the carrier moving and mounting device 3 is controlled such that if all of the delivery mounting units 211 and 212 for wafer carry-in are occupied by carriers C when the priority carrier is carried into the retreat mounting unit 225 or 226 serving as the carrier carry-in unit, the carrier moving and mounting device 3 moves and mounts one of the carriers on the retreat mounting unit 22 and mounts the priority carrier on the delivery mounting unit 211 or 212 which has become vacant by the movement.

Figure 8:
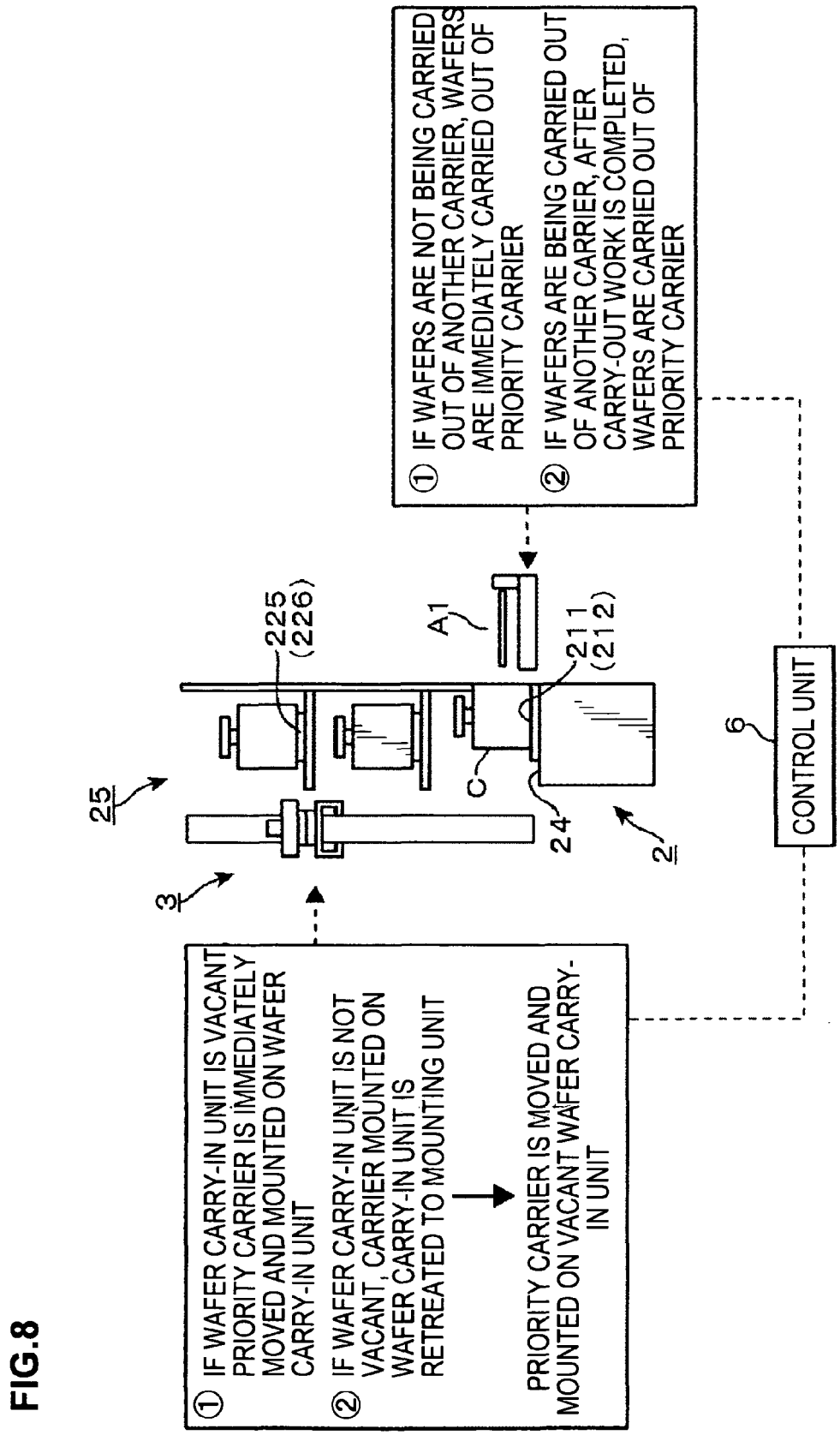
FIG. 8 is a side view for explaining the operation of the resist pattern forming system.

More specifically, as shown in FIG. 8,
(1) if the delivery mounting unit 211 or 212 for wafer carry-in has no carrier mounted thereon when the priority carrier is mounted on the retreat mounting unit 225 (226) serving as the carrier carry-in unit, the carrier moving and mounting device 3 is controlled to immediately move and mount the priority carrier on the delivery mounting unit 211 (212), and
(2) if all of the delivery mounting units 211 and 212 for wafer carry-in are occupied by carriers when the priority carrier is mounted on the retreat mounting unit 225 (226) serving as the carrier carry-in unit, the carrier moving and mounting device 3 is controlled to retreat one of the carriers mounted on the delivery mounting units 211 and 212 to the retreat mounting unit 22 and then move and mount the priority carrier on the delivery mounting unit 211 (212) for wafer carry-in which has become vacant by the retreat.

In this event, if all of the plural delivery mounting units 211 and 212 are occupied by carriers and when wafers are being carried out of one of the carriers as in this embodiment, the carrier from which wafers are not being carried out is immediately retreated to the retreat mounting unit 22. Further, if there is one delivery mounting unit and when wafers are being carried out of the carrier, the control is conducted such that the carrier is retreated to the retreat mounting unit 22 immediately after all of the wafers are carried out of the carrier.

The delivery device A1 is controlled such that when the priority carrier is mounted on the delivery mounting unit 211 or 212 for wafer carry-in, the delivery device A1 carries out the wafers in the priority carrier prior to those in the other carriers. More specifically, as shown in FIG. 8,
(1) if the delivery device A1 is not carrying wafers out of another carrier when the priority carrier is mounted on the delivery mounting unit 211 or 212 for wafer carry-in, the delivery device. A1 is controlled to immediately carry out the wafers in the priority carrier, and
(2) if the delivery device A1 is carrying the wafers out of another carrier when the priority carrier is mounted on the delivery mounting unit 211 or 212 for wafer carry-in, the delivery device A1 is controlled to carry all of the wafers out of the other carrier and then carry the wafers out of the priority carrier on a priority basis.

The carry control unit 66 of the control unit 6 is a unit controlling the carrier moving and mounting device 3, the delivery device A1, the main arms A2 and A3 and so on, and is configured to execute a predetermined carry work referring to the carry schedule and the moving and mounting schedule.

Subsequently, the operation of this embodiment will be described. Explaining normal treatment first, the operator selects lots to be treated, a treatment recipe, and a carry schedule and a moving and mounting schedule prior to start of the treatments on the wafers being substrates. This determines the treatment order of the lots, then the wafers are carried out of the carriers C into the treatment block B2 following the treatment order, and the control unit 6 outputs instructions to the units and devices referring to the selected carry schedule and moving and mounting schedule to carry the wafers out to the treatment block B2 in the determined order and execute treatments thereon.

In this example, it is assumed that the treatments are performed, for example, for the lot L1 to the lot L6 in the order of the lot L1, the lot L2, the lot L3, the lot L4, the lot L5, and the lot L6. Since a carrier is prepared for each of the lots here, the treatment order of the lots corresponds to both of the order that the carriers corresponding to the lots are carried into the retreat mounting unit 225 or 226 serving as the carrier carry-in unit and the order that the carriers are carried into the wafer carry-in unit 211 or 212.

Accordingly, in the carrier block B1, the external carrier carry device 200 first carries the carriers in order starting from the carrier C1 for the lot L1, and then in the order of the carrier C2 for the lot L2, the carrier C3 for the lot L3, the carrier C4 for the lot L4, the carrier C5 for the lot L5, and the carrier C6 for the lot L6, into the carrier carry-in unit 225 or 226 serving as the carrier carry-in unit. Then, the carrier moving and mounting device 3 moves the carriers C1 to C6 from the carrier carry-in unit 225 or 226 and mounts them on the delivery mounting unit 211 or 212 for wafer carry-in in order starting from the carrier C1, and then in the order of the carrier C2, the carrier C3, the carrier C4, the carrier C5, and the carrier C6 directly or via the other retreat mounting unit 22 in the stocker 25, for example, according to the moving and mounting schedule.

After the carrier C1 is first moved and mounted on the delivery mounting unit 211 for wafer carry-in and the lid body of the carrier C1 is opened, the wafers in the carrier C1 are received by the delivery device A1 and carried out to the treatment block B2. Subsequently, the next carrier C2 is moved and mounted, for example, on the wafer carry-in unit 212 by the carrier moving and mounting device 3, and the wafers in the carrier C2 are carried out to the treatment block B2. In this manner, the carriers are moved to and mounted on one of the delivery mounting units 211 and 212 for wafer carry-in, in the order of the carrier C3, the carrier C4, the carrier C5, and the carrier C6, and the wafers therein are carried out to the treatment block B2 in sequence by the delivery device A1. In this event, the vacant carriers after the wafers are carried out of them are moved to and mounted on the retreat mounting units 22 which have been previously determined by the moving and mounting schedule, and next carriers are carried into the delivery mounting units 211 and 212 for wafer carry-in.

On the other hand, in the treatment block B2, the main arms A2 and A3 carry the wafers in the order that the wafers are carried out of the carrier block B1, that is, in order from the wafers in the carrier C1 to the predetermined module according to the carry schedule. The main arms A2 and A3 here sequentially shift the wafers starting from the wafer in the downstream module to the next module in the order using two or more holding arms to form a state in which the wafer that is prior in the order is located in the module downstream from the module of the wafer that is subsequent in the order as has been described, thereby executing one cycle (the carry cycle). Then, after completion of the cycle, the main arms A2 and A3 shift to the next cycle and execute cycles in sequence, whereby the wafers are sequentially carried to the modules along the above-described passage, and predetermined treatments are performed on the wafers.

The wafers in the carrier C1 for which treatments have been completed in the above-described manner are returned by the delivery device A1 into the original carrier C1 mounted on the delivery mounting unit 213 or 214 for wafer carry-out. The carrier C1 here has been moved and mounted by the carrier moving and mounting device 3 through a passage of the delivery mounting unit 211 for wafer carry-in, the retreat mounting unit 22, and the delivery mounting unit 213 (214) for wafer carry-out in the carrier station 2 according to the moving and mounting schedule. In this manner, the wafers corresponding to the carriers C2 to C6 are also returned sequentially, after completion of treatments, into the respective original carriers C2 to C6 which have been moved to and mounted on the delivery mounting unit 213 or 214 for wafer carry-out.

Figure 9:
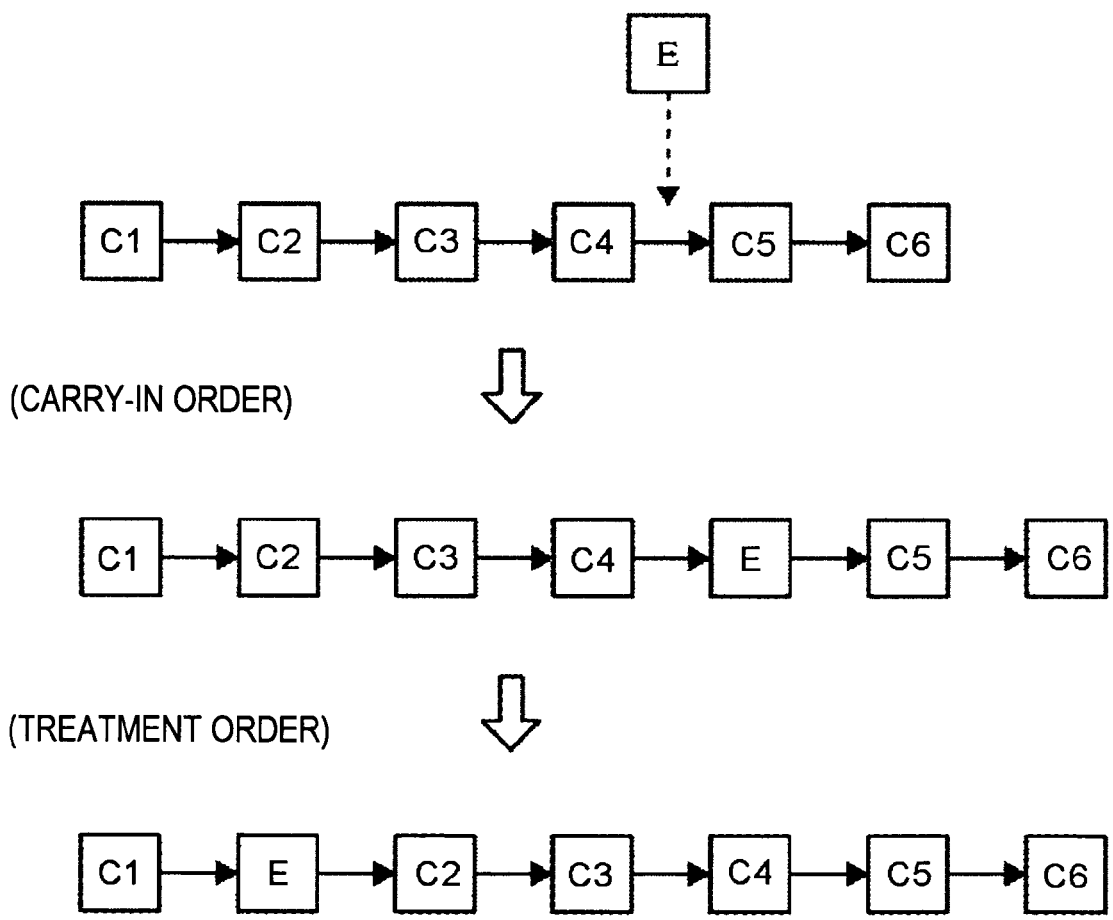
FIG. 9 is an explanatory view for explaining the operation of the resist pattern forming system.
Figure 10:
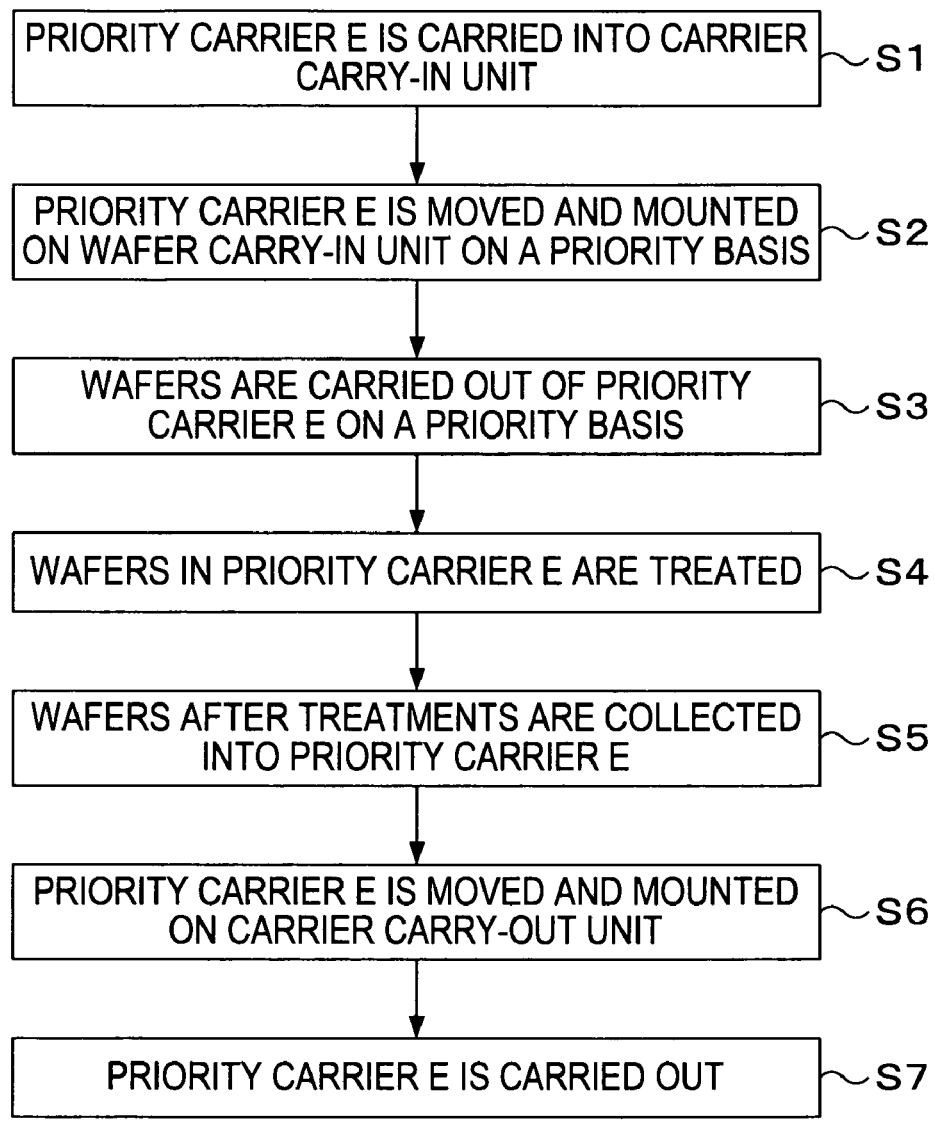
FIG. 10 is a flowchart for explaining the operation of the resist pattern forming system.
Figure 11:
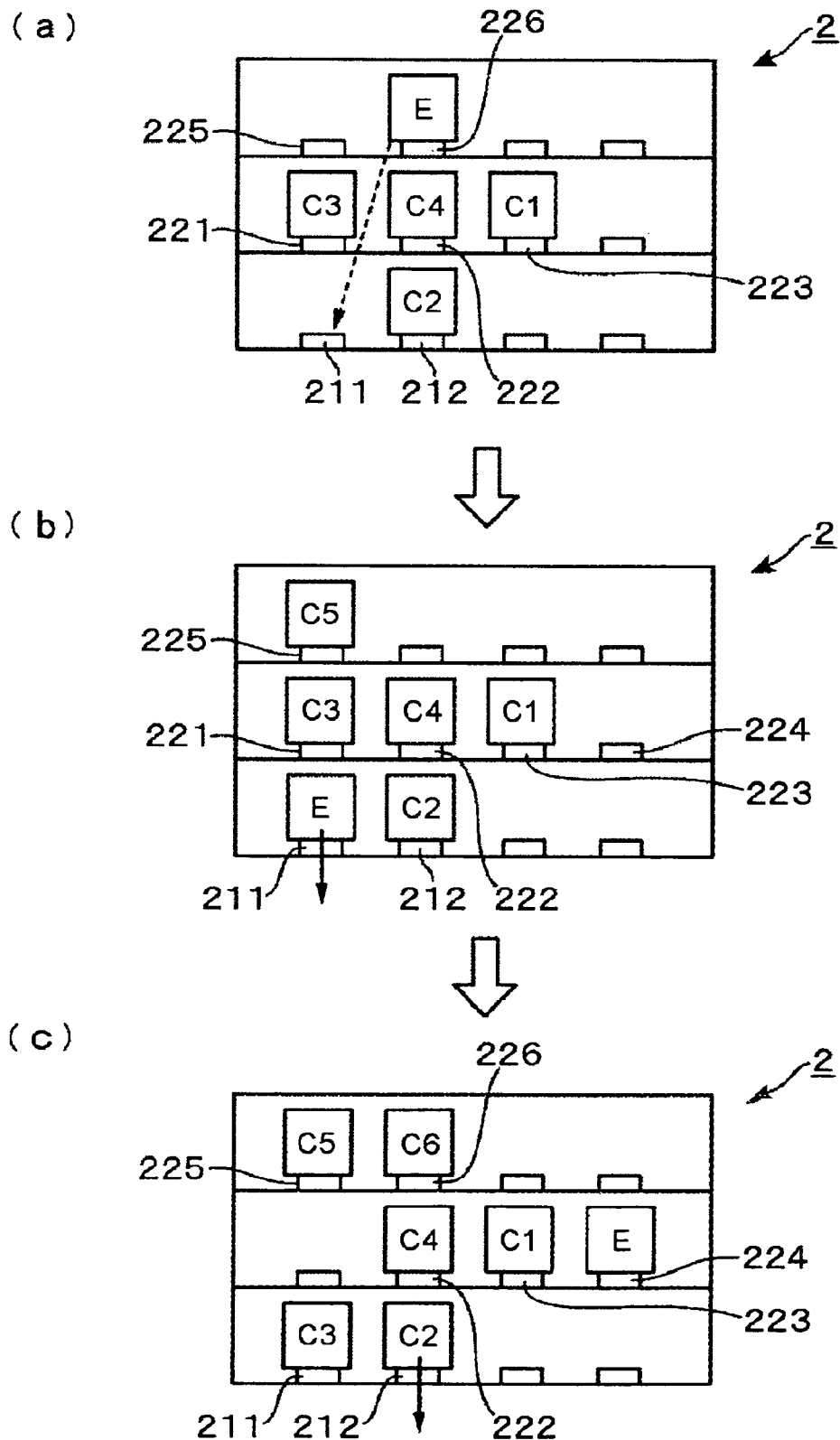
FIG. 11 is a process chart for explaining the operation of the resist pattern forming system.
Figure 12:
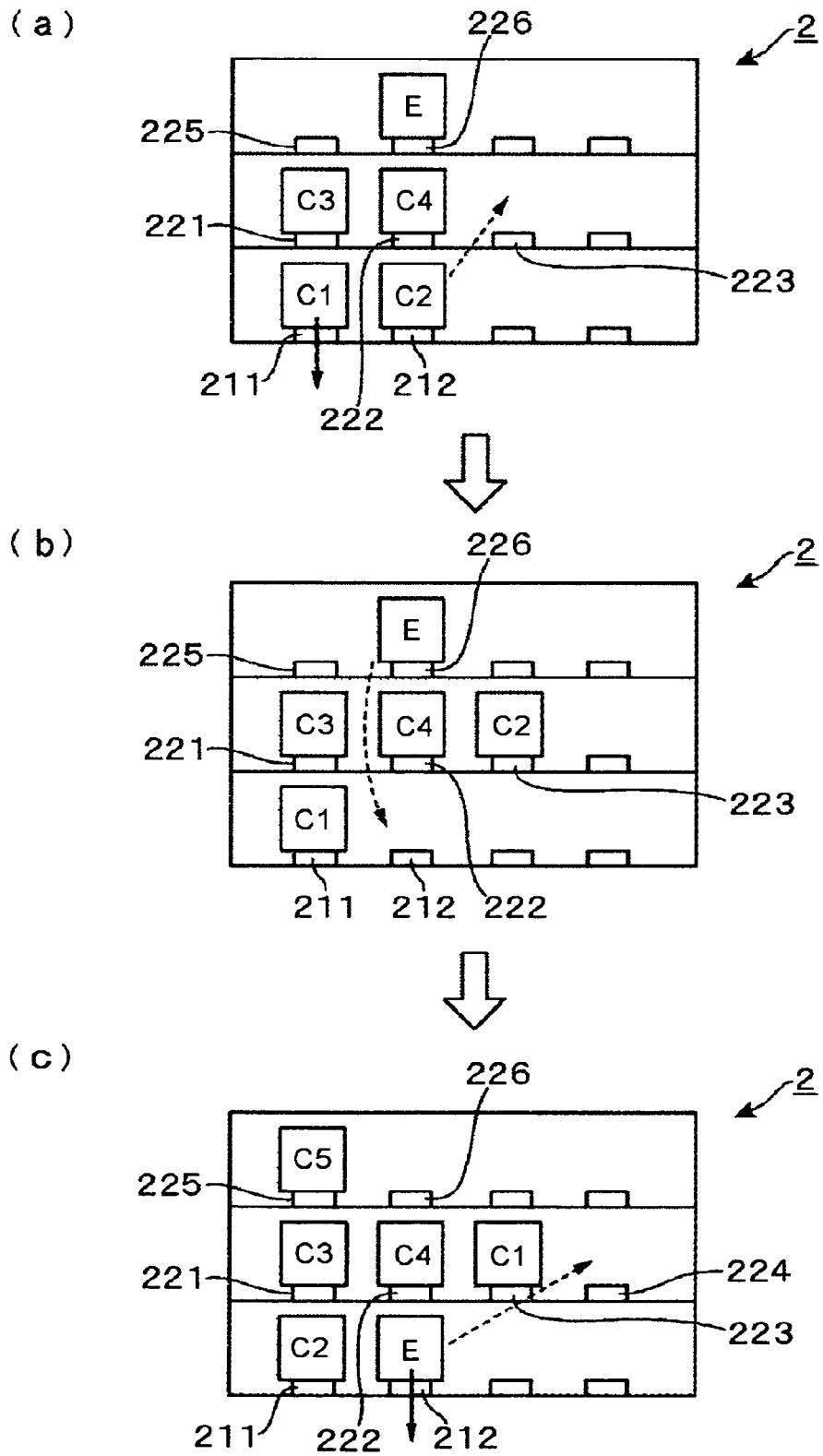
FIG. 12 is a process chart for explaining the operation of the resist pattern forming system.

Next, a case where the priority carrier has been generated will be described with reference to FIG. 9 to FIG. 12. Note that FIG. 11 and FIG. 12 are views of the carrier station 2 seen from the carrier moving and mounting device 3 side. In this case, for example, the operator instructs a host computer controlling a plurality of apparatuses including the resist pattern forming system that a priority lot has been generated, and the host computer determines the order number of carrying the priority carrier for the priority lot into the resist pattern forming system, and outputs the order number of carrying the carrier, to the control unit 6 of the resist pattern forming system. For example, in the case where the carriers are carried from the external part into the retreat mounting units 225 and 226 serving as the carrier carry-in units in the order of the carrier C1, the carrier C2, the carrier C3, the carrier C4, the carrier C5, and the carrier C6 as shown in FIG. 9, a case where a priority carrier E is carried between carriage of the carrier C4 and the carrier C5 will be described as an example. In this case, the order of the carriers to be carried into the retreat mounting unit 225 (226) serving as the carrier carry-in unit is C1, C2, C3, C4, E, C5, and C6 as shown in FIG. 9.

When the priority carrier E is carried into the retreat mounting unit 225 (226) serving as the carrier carry-in unit (Step S1), the carrier moving and mounting device 3 moves and mounts the priority carrier E on a priority basis to the delivery mounting unit 211 (212) for wafer carry-in (Step S2). More specifically, if the delivery mounting unit 211 for wafer carry-in does not have the carrier C mounted thereon as shown in (a) of FIG. 11, the priority carrier E is moved and mounted on the delivery amounting unit 211 (see (b) of FIG. 11). Besides, if all of the delivery mounting units 211 and 212 for wafer carry-in are occupied by the carriers C1 and C2 as shown in (a) of FIG. 12, one of the carriers C1 and C2 is retreated, and the priority carrier E is moved and mounted on the delivery mounting unit 211 or 212 which has becomes vacant thereafter. In this example, since the wafers are being carried out of the carrier C1 by the delivery device A1, the other carrier C2 is retreated to the vacant retreat mounting unit 223 as shown in (b) of FIG. 12, and then the priority carrier E is moved and mounted on the vacant delivery mounting unit 212 (see (c) of FIG. 12).

When the priority carrier E is carried into the delivery mounting unit 211 (212) for wafer carry-in in this manner, the delivery device A1 carries the wafers out of the priority carrier E on a priority basis (Step S3). More specifically, if the delivery device A1 is not carrying the wafers out of another carrier C when the priority carrier E is mounted on the delivery mounting unit 211 (212) for wafer carry-in, the delivery device A1 immediately carries the wafers out of the priority carrier E, whereas if the delivery device A1 is carrying the wafers out of another carrier C when the priority carrier E is mounted on the delivery mounting unit 211 (212) for wafer carry-in, immediately after carry-out of all of the wafers from the carrier is completed, the delivery device A1 carries the wafers out of the priority carrier E.

In this manner, the wafers in the priority carrier E carried out to the treatment block B2 are carried among the modules along the predetermined carry passage in the order that they have been carried out into the treatment block B2, and subjected to the predetermined treatments (Step S4). The wafers after the treatments are retuned into the original priority carrier E (Step S5). The priority carrier E thus housing the treated wafers is quickly moved and mounted on the retreat mounting unit 227 (228) serving as the carrier carry-out unit by the carrier moving and mounting device 3 (Step S6), and carried out of the resist pattern forming system by the external carrier carry device 200 (Step S7), and carried to the next process.

In this example, the wafers in the priority carrier E are carried out to the treatment block B2 subsequent to those in the carrier C1, and after the priority carrier E, wafers in the other carriers are carried out into the treatment block B2 and subjected to treatments in the order of, for example, the carrier C2, the carrier C3, the carrier C4, the carrier C5, and the carrier C6 as shown in FIG. 9. Accordingly, in this example, the priority carrier E is moved and mounted on the delivery mounting unit 211 or 212 for wafer carry-in having priority over the carriers C2 to C4 which have been carried into the retreat mounting units 225 and 226 serving as the carrier carry-in units prior to the priority carrier E, and the wafers in the priority carrier E are carried out, having priority over the wafers in the carriers C2 to C4, into the treatment block B2 and subjected to treatments.

Figure 13:
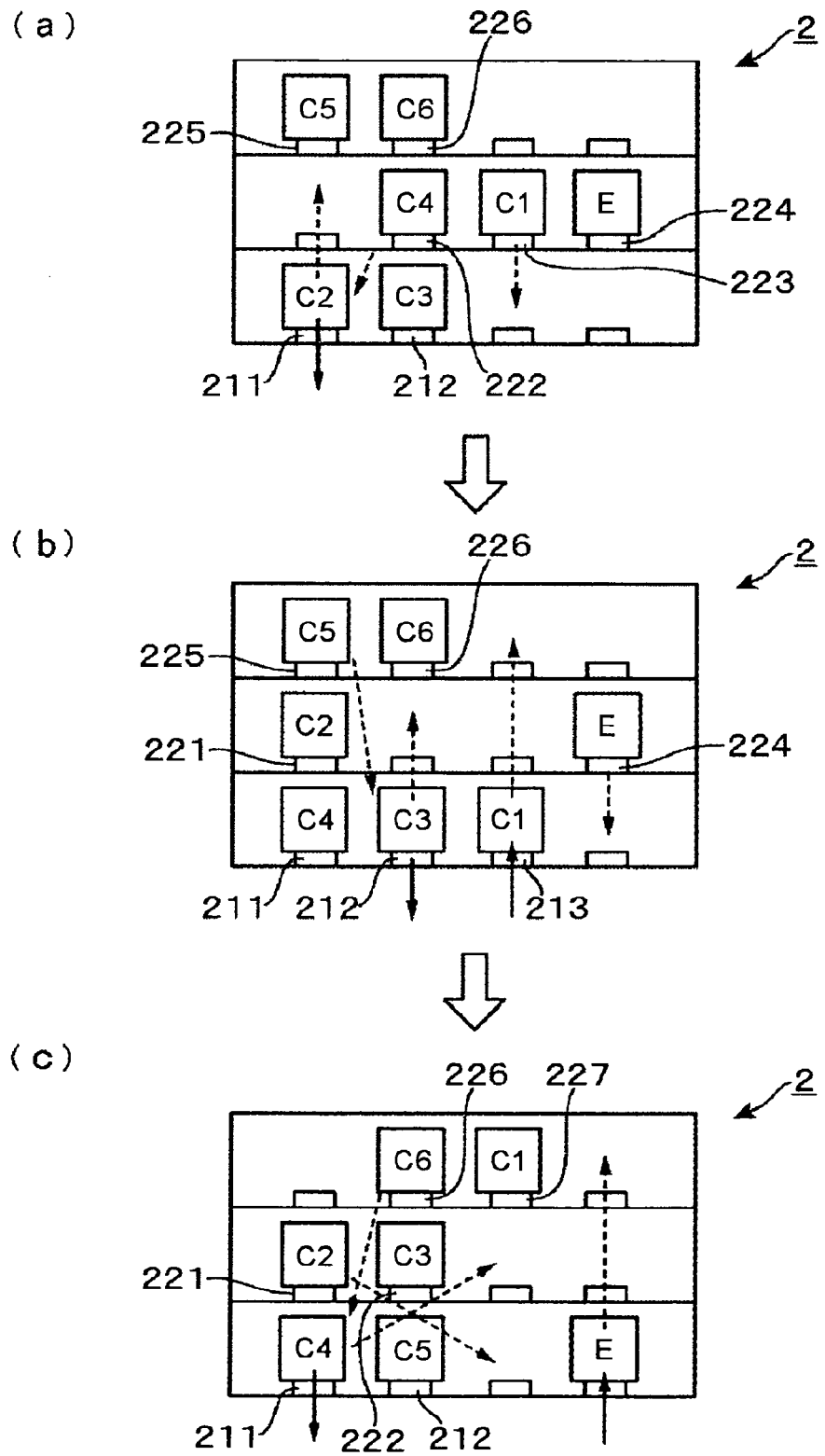
FIG. 13 is a process chart for explaining the operation of the resist pattern forming system.
Figure 15:
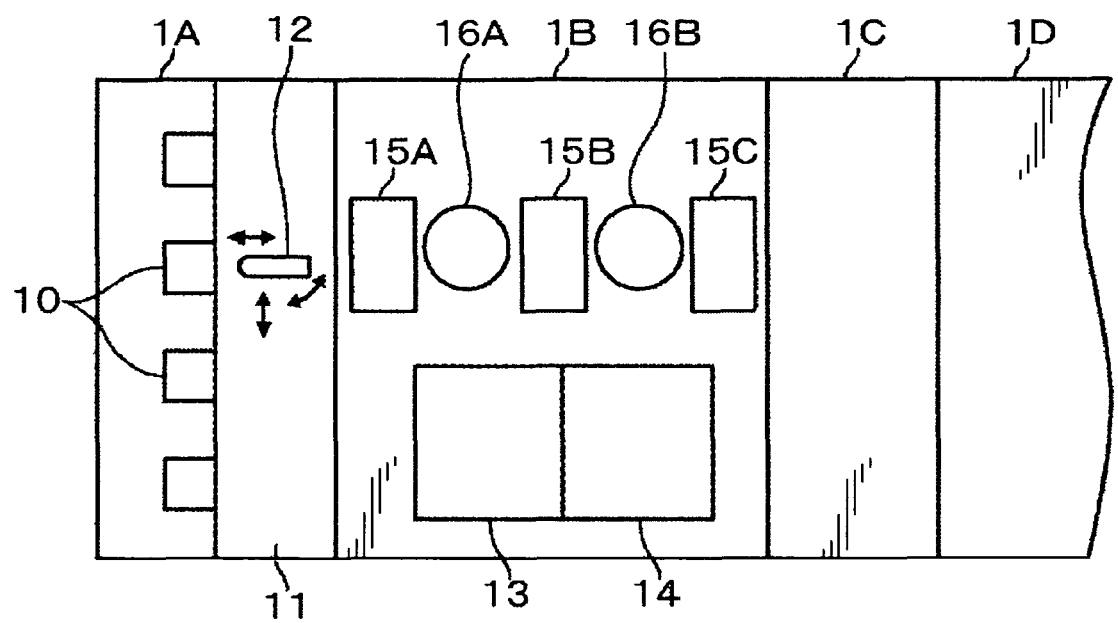
FIG. 15 is a plan view showing a conventional coating and developing apparatus.

In this event, after all of the wafers in the priority carrier E are carried out to the treatment block B2 by the delivery device A1, the wafers are carried out of the subsequent carrier C2 that is next in the treatment order to the treatment block B2, and the priority carrier E is moved and mounted on the retreat mounting unit 224 as shown in (c) of FIG. 11 or (a) of FIG. 13. In this manner, the carriers C3 to C6 are moved and mounted in sequence on the delivery mounting unit 211 or 212 for wafer carry-in, and the wafers are carried out of the carriers C3 to C6 in sequence to the treatment block B2 as shown in (a) of FIG. 13 to (b) of FIG. 14.

In this case, concurrently with the timing when the treatments on the wafers in the treatment block B2 are completed, the carriers corresponding to the wafers under treatment are also moved and mounted on the delivery mounting units 213 and 214 for wafer carry-out. For example, concurrently with the timing when the treatments on the wafers corresponding to the priority carrier E are completed, the priority carrier E is moved from the retreat mounting unit 224 and mounted on the wafer carry-out unit 214 as shown in (b) and (c) of FIG. 13. Then, the priority carrier E into which the treated wafers have been returned is moved and mounted on the retreat mounting unit 227 serving as the carrier carry-out unit and carried therefrom to the next process by the external carrier carry device 200 as shown in (a) and (b) of FIG. 14.

The control of the carrier moving and mounting device 3 and the delivery device A1 is conducted by outputting, for example, the information that a priority lot has been generated from the host computer to the control unit 6 of the coating and developing apparatus and rewriting the moving and mounting schedule and the carry schedule before the priority carrier E is carried into the retreat mounting unit 225 or 226 serving as the carrier carry-in unit. In other words, since the order number of carrying-in of the priority carrier E is known, the mounting status of the carriers in the carrier station 2 at the timing when the priority carrier E is carried into the retreat mounting unit 225 or 226 serving as the carrier carry-in unit is grasped based on the moving and mounting schedule and the carry-in schedule for the normal treatment before the priority carrier E is carried in, and the moving and mounting schedule is rewritten such that the priority carrier E is carried into the wafer carry-in unit 211 or 212 on a priority basis as has been described, and after the priority carrier E is once retreated to the retreat mounting unit 22 and then moved and mounted on the delivery mounting unit 213 or 214 for wafer carry-out at the timing when the treated wafers corresponding to the priority carrier are returned, and the carry schedule is rewritten such that the wafers in the priority carrier are carried out to the treatment block B2 on a priority basis.

When the priority carrier E is carried into the retreat mounting unit 225 or 226 serving as the carrier carry-in unit, the moving and mounting work of the carriers and carriage of the wafers are performed by the carrier moving and mounting device 3, the delivery device A1, and the main arms A2 and A3 according to the rewritten moving and mounting schedule and carry schedule.

Further, instead of rewriting the moving and mounting schedule, whether or not a carrier C is mounted on the delivery mounting unit 211 or 212 for wafer carry-in and which of the retreat mounting units 22 is vacant may be judged based on the addresses given to the delivery mounting units 21 and the retreat mounting units 22, the information from the presence sensors 232 for the carriers C provided on the delivery mounting units 21 and the retreat mounting units 22, and the IDs given to the carriers C, and then movement and mounting of the priority carrier and the carriers C may be performed.

According to the above embodiment, the stocker 25 for temporarily storing the carriers C is provided in the carrier station 2, many mounting units for the carriers C are arranged in the stocker 25, and the mounting units also serve as the retreat mounting units 22 for allowing the carriers C to retreat thereto, thereby enhancing the utility value of the stocker 25. More specifically, in the case where a priority lot which will be subjected to treatments having priority over other lots has been generated, if all of the delivery mounting units 211 and 212 for wafer carry-in are occupied by the carriers when the priority carrier E for the priority lot is carried into the retreat mounting unit 225 or 226 serving as the carrier carry-in unit of the carrier block B1, the occupying carrier is moved and mounted on the retreat mounting unit 22 so that the priority carrier E can be mounted on the delivery mounting unit 211 or 212 which has become vacant by the movement. This makes it possible to move and mount the priority carrier E on the delivery mounting unit 211 or 212 for wafer carry-in after a short waiting time and immediately deliver the wafers in the priority carrier E to the treatment block B2. Accordingly, it is possible to reduce the waiting time of the wafers in the priority carrier E before start of treatments.

Further, also when the priority carrier E has been generated, the priority carrier E and the other carriers C1 to C6 are moved and mounted in sequence on the delivery mounting unit 211 or 212 for wafer carry-in and the wafers therein are carried out in sequence by moving and mounting the priority carrier E and the carriers C1 to C6 from which the wafers have been carried out to the retreat mounting units 22, so that the wafers therein can be quickly supplied to the treatment block B2 to suppress a decrease in throughput.

Furthermore, since the priority carrier E is moved and mounted on the retreat mounting unit 22 after carry-out of the wafers is completed, and moved and mounted on the delivery mounting unit 213 or 214 for wafer carry-out again at the timing when the treated wafers are returned into the priority carrier E, the treated wafers are quickly collected into the priority carrier E. Further, since the priority carrier E housing the treated wafers is quickly moved and mounted on the retreat mounting unit 226 or 227 serving as the carrier carry-out unit, the priority carrier E is smoothly carried to the next process by the external carrier carry device 200.

The present invention is also applicable to a resist pattern forming system which treats not only the semiconductor wafer but also a substrate such as a glass substrate (LCD substrate) for a liquid crystal display and so on. Further, the shape of the carrier moving and mounting device 3 is not limited to the above-described configuration. Further, the configuration of the storage unit (stocker) temporarily storing the carriers is not limited to that in the above-described example, and the mounting units for carriers may be provided below the delivery stage 24 or the mounting units for carriers may be provided opposite the delivery stage 24. Further, in the mounting units in the storage unit, a carrier housing untreated wafers, a carrier housing treated wafers, a vacant carrier and the like are temporarily stored, and all of the mounting units are not necessarily used as the retreat mounting units.

Furthermore, the delivery mounting unit may serve both as the mounting unit used when the wafers are carried out of the carrier block B1 into the treatment block B2 and as the mounting unit used when the wafers are returned from the treatment block B2 to the carrier block B1. Further, the number of delivery mounting units accessed by the delivery device A1 is arbitrarily selected.

Furthermore, the substrate treatment apparatus of the present invention is also applicable to a vertical type thermal treatment apparatus and a cleaning apparatus of a type of processing a number of wafers in a batch.

What is claimed is:

1. A substrate treatment apparatus comprising delivery mounting units on each of which a carrier housing a plurality of substrates is mounted, said delivery mounting unit being prepared for each carrier, for performing treatments on the substrates carried out of the carriers mounted on said delivery mounting units by a delivery device and then returning the substrates into original carriers on said delivery mounting units by said delivery device, said apparatus comprising:

a plurality of retreat mounting units separately provided from said delivery mounting units, for mounting the carriers thereon;

a carry-in mounting unit separately provided from said delivery mounting units, for carrying one of the carriers from an external part into said substrate treatment apparatus;

a carrier moving and mounting device moving and mounting the carriers among said delivery mounting units, retreat mounting units, and carry-in mounting unit;

a control unit controlling said carrier moving and mounting device such that at normal time, said carrier moving and mounting device moves and mounts the carriers in sequence to said delivery mounting units directly or via said retreat mounting units according to a carry-in order of the carriers carried into said carry-in mounting unit, and when a priority carrier having a priority higher than priorities of the carriers in sequence and housing substrates in a priority lot which will be subjected to treatments on a priority basis is carried into said carry-in mounting unit and if all of said delivery mounting units are occupied by the carriers, said carrier moving and mounting device moves one of the carriers on one of the delivery mounting units and mounts the one of the carriers on said retreat mounting units, and mounts the priority carrier on the one of said delivery mounting units which has become vacant by the movement; and a control unit controlling said delivery device such that at normal time, said delivery device carries the substrates out of the carriers according to the carry-in order of the carriers mounted on said delivery mounting units, and when the priority carrier is mounted on the one of said delivery mounting units, said delivery device carries out the substrates in the priority carrier before the substrates in the other carriers.

2. The substrate treatment apparatus as set forth in claim 1, wherein said control unit controlling said carrier moving and mounting device controls said carrier moving and mounting device such that if the one of said delivery mounting units is vacant when the priority carrier is carried into said carry-in mounting unit, said carrier moving and mounting device immediately mounts the priority carrier on the one of said delivery mounting units.

3. The substrate treatment apparatus as set forth in claim 1, wherein said control unit controlling said carrier moving and mounting device controls said carrier moving and mounting device such that if all of said delivery mounting units are occupied by the carriers and the substrates are being carried out of one of the carriers by said delivery device when the priority carrier is carried into said carry-in mounting unit, said carrier moving and mounting device moves and mounts another one of the carriers other than the one carrier on the one of said retreat mounting units.

4. The substrate treatment apparatus as set forth in claim 1, wherein said control unit controlling said delivery device controls said delivery device such that if the substrates are not being carried out of another carrier when the priority carrier is carried into said delivery mounting unit, said delivery device carries the substrates out of the priority carrier on a priority basis, and if the substrates are being carried out of another carrier when the priority carrier is carried into the one of said delivery mounting units, said delivery device carries the substrates out of the priority carrier on a priority basis after the carry-out of all of the substrates from the other carrier is completed.

5. The substrate treatment apparatus as set forth in claim 1, further comprising:

a storage unit for temporarily storing the plural carriers, and said retreat mounting units also serve as mounting units for the carriers provided in said storage unit.

6. The substrate treatment apparatus as set forth in claim 1, further comprising:

a treatment block performing treatments on the substrates carried out of the carriers by said delivery device, said treatment block including a plurality of modules which perform treatments on the substrates or on which the substrates are mounted to form a coating film on the substrates and perform development on the substrates after exposure, and a substrate carry device performing carriage of the substrates among said plural modules.

* * * * *